United States Patent [19]
Chandross et al.

[11] Patent Number: 6,045,977
[45] Date of Patent: Apr. 4, 2000

[54] PROCESS FOR PATTERNING CONDUCTIVE POLYANILINE FILMS

[75] Inventors: Edwin Arthur Chandross, Murray Hill; Francis Michael Houlihan, Millington; Afshin Partovi, Summit; Xina Shu-Wen Quan, Bridgewater, all of N.J.; Ganesh Venugopal, Duluth, Ga.

[73] Assignee: Lucent Technologies Inc., Murray Hill, N.J.

[21] Appl. No.: 09/026,227

[22] Filed: Feb. 19, 1998

[51] Int. Cl.[7] ....................................................... H01B 1/12
[52] U.S. Cl. .......................... 430/311; 430/326; 430/329; 427/553; 427/96; 427/337
[58] Field of Search .................................. 430/311, 326, 430/329; 427/553, 595, 96, 257.1, 258.2, 337, 385.5

[56] References Cited

U.S. PATENT DOCUMENTS 5,626,795  5/1997  Smith et al. .............................. 252/500

FOREIGN PATENT DOCUMENTS 0 615 257  9/1994  European Pat. Off. .
8-092542  4/1996  Japan .
8253755  10/1996  Japan .

OTHER PUBLICATIONS

Bargon, J. et al., "Lithographic Patterning of Conducting Polymers and their Composites", *Synthetic Metals*, vol. 41–43, pp. 1111–1114 (1991).
Angelopolous, M. et al., "Conducting Polymers as Lithographic Materials", *Polymer Eng. & Sci.*, vol. 32, No. 20, pp. 1535–1540 (1992).
Venugopal, G. et al., "Photoinduced Doping and Photolithography of Methyl-Substituted Polyaniline", *Chem. Mater*, vol. 7, No. 2, pp. 271–276 (1995).

*Primary Examiner*—John A. McPherson
*Attorney, Agent, or Firm*—Patricia A. Verlangieri

[57] ABSTRACT

A method for making a device in which a conductive polyaniline layer (polyaniline salt layer) is formed on a substrate and patterned into a desired configuration, is disclosed. The polyaniline salt containing layer is formed by applying a polyaniline salt solution which combines a mixture of polyaniline and an additive, dissolved in a solvent on the substrate. Thereafter, the polyaniline salt containing layer is patterned by delineating in such layer at least one region having a conductivity less than about $10^{-6}$ S/cm. The at least one region in the polyaniline salt containing layer having a conductivity less than about $10^{-6}$ S/cm is optionally formed by combining a photobase generator (PBG) with the polyaniline salt solution. An adhesive is optionally mixed with the polyaniline salt solution for forming an polyaniline salt/adhesive polymer layer which is patterned into the desired configuration.

10 Claims, 2 Drawing Sheets

PROTONATION OF POLYANILINE

MOLE RATIO OF CAMPHORSULFONIC ACID (CSA): EMERALDINE ANILINE MONOMERS

PROCESS FOR PATTERNING CONDUCTIVE POLYANILINE FILMS

1. FIELD OF THE INVENTION

The present invention relates generally to the fabrication of integrated circuits and the like devices, and more particularly, to methods for patterning conductive polyaniline films.

2. DESCRIPTION OF THE RELATED ART

Recently, conductive polymers such as polyaniline have been investigated for use in integrated circuits. Conductive polymers are attractive for use in integrated circuits because some are environmentally stable compounds, easily synthesized from inexpensive raw materials. Such advantages are important when fabricating low-cost, large area integrated circuits. In order for a conductive polymer to be useful on an integrated circuit, the conductive polymer should have a conductivity greater than about $10^{-2}$ S/cm (Siemens/centimeter). The conductivity describes the ability of the polymer to conduct an electric current.

Several processes have reported the formation of integrated circuit features made of conductive polymers. However, for each reported process a non-conductive polymer layer is first formed on a substrate and thereafter converted to a conductive polymer layer. The non-conductive polymer layer is formed by applying a solution containing the non-conductive polymer on the substrate. The non-conductive polymer layer has a conductivity less than about $10^{-7}$ S/cm. The non-conductive polymer is applied on the substrate because conductive polymers typically have low solubilities in many commonly used solvents. The low solubility of conductive polymers in many commonly used solvents inhibits the formation of conductive polymer layers from solutions containing conductive polymers.

One process described in Bargon, J., et al., "Lithographic Patterning of Conducting Polymers and their Composites", *Synthetic Metals*, vol. 41–43, pp. 1111–1114 (1991), discusses the formation of a non-conductive composite of poly(vinyl chloride) and ferric chloride ($FeCl_3$) on a substrate. Upon exposure to radiation, the ferric chloride in irradiated areas of the nonconductive composite is converted to an inactive ferrous salt. Thereafter, the ferric chloride remaining in the unexposed areas of the non-conducting composite, oxidatively polymerizes pyrrole vapor (introduced during a development step) and forms an electrically conducting composite of polypyrrole and poly(vinyl chloride).

Another process, described in Angelopolous, M., et al., "Conducting Polymers as Lithographic Materials", *Polymer Eng. & Sci.*, vol. 32, No. 20, pp. 1535–1540 (1992), discusses the formation of a film containing triphenylsulfonium hexafluoroantimonate and a non-conductive polyaniline compound on a substrate. The non-conductive film, which has a blue color, was formed from a solution containing the non-conductive polyaniline compound and the triphenylsulfonium hexafluoroantimonate dissolved in N-methylpyrrolidinone (NMP). Upon irradiation the triphenylsulfonium hexafluoroantimonate donates protons to the non-conductive polyaniline compound, converting it to a polyaniline material having a green color. This green color indicates that the polyaniline film has a conductivity greater than about $10^{-3}$ S/cm. Conductive polyaniline materials formed according to the process of Angelopolous et al. have conductivities of about 0.1 S/cm.

Additionally, in Venugopal, G., et al., "Photoinduced Doping and Photolithography of Methyl-Substituted Polyaniline", *Chem. Mater.*, Vol. 7, No.2, pp. 271–276 (1995) nonconductive methyl substituted polyaniline, poly (o-toluidine), is converted to conductive polyaniline using hydrochloric acid (HCl) vapor. Conductivity values for these films ranged from about $10^{-4}$ S/cm to about $10^{-3}$ S/cm Also, several processes attach integrated circuits on printed wiring boards using conductive adhesives. Conductive adhesives are generally made of an adhesive matrix that is filled with conductive particles such as silver flakes or carbon particles. The conductive particles individually or in aggregate typically have dimensions of about 5 micrometers ($\mu$m). The conductive adhesives provide an electrical and a mechanical interconnection between contact pads of the integrated circuit and the printed wiring boards.

SUMMARY OF THE INVENTION

The present invention is directed to a process for making a device, e. g., an integrated circuit (IC), in which a conductive polyaniline layer is first formed on a substrate and thereafter patterned to form a desired configuration. The conductive polyaniline layer is a polyaniline salt containing layer which has a conductivity of at least about $10^{-2}$ S/cm. The polyaniline salt containing layer is formed on the substrate by applying a polyaniline salt solution which is a mixture of polyaniline and an additive, dissolved in a solvent.

Polyaniline is formed by polymerizing aniline monomers. The resulting polymer has a variety of oxidation states ranging from the leucoemeraldine base form, where all of the repeat units are phenylenediamine units, to the fully oxidized pernigraniline base form, where all of the repeat units are quinoidal-diimine units. In one embodiment of the present invention, the polyaniline is emeraldine polyaniline, depicted in FIG. 1, in which the repeat units 3 are roughly equal amounts of phenylenediamine units 5 and quinoidal-diimine units 7. The phenylenediamine units 5 and quinoidal-diimine units 7 are either substituted or unsubstituted. If substituted, examples of suitable substituents are alkyls and aryls.

The additive, when dissolved in the solvent, dissociates and donates protons to the polyaniline. Protonated polyaniline is a polyaniline salt. Examples of additives suitable for protonating polyaniline to form a soluble material are camphorsulfonic acid (CSA) and alkylbenzenesulfonic acid (see Smith et al., U. S. Pat. 5,626,795, which is herein incorporated by reference).

The conductivity of the polyaniline salt depends on the fraction of imine nitrogens 11 (FIG. 1) on the polyaniline that are protonated. The conductivity of the polyaniline salt increases with the fraction of imine nitrogens 11, for fractions less than about 0.5.

In order to facilitate formation of the polyaniline salt, it is desirable that the mixture of the additive and the polyaniline be soluble in the solvent. When the mixture of the additive and the polyaniline are not soluble in the solvent, it is difficult to protonate the polyaniline. Examples of solvents suitable for dissolving the polyaniline and the additive are 2, 2, 2-trifluoroethanol (TFE) and cyclohexanone.

In the process of the present invention, a polyaniline salt containing layer is formed by applying the polyaniline salt solution comprising the mixture of polyaniline and the additive, dissolved in the solvent on a substrate. The polyaniline salt solution is applied to the substrate using a variety of techniques well known to those skilled in the art, such as spin-coating and casting. After the polyaniline salt solution is applied on the substrate the solvent is evaporated, forming the polyaniline salt containing layer.

The polyaniline salt containing layer is patterned into a desired configuration by forming at least one region therein with a conductivity less than about $10^{-6}$ S/cm. In one embodiment conventional lithography techniques well known to one skilled in the art are used to delineate a patterned photoresist mask layer over the polyaniline salt containing layer. The portion of the polyaniline salt containing layer that is not covered by the masking layer is exposed to an aqueous base solution. In regions where the aqueous basic solution contacts the underlying polyaniline salt containing layer, the conductivity is reduced to less than about $10^{-6}$ S/cm. Examples of aqueous basic solutions suitable for reducing the conductivity of the polyaniline salt containing layer include sodium hydroxide and tetramethylammonium hydroxide.

Some substrates have metal thereon which is etched by aqueous basic solutions such as sodium hydroxide. In an alternate embodiment of the present process, the polyaniline salt containing layer is formed from a polyaniline salt solution which combines a mixture of the polyaniline, the additive, and a photobase generator (PBG), dissolved in the solvent. The term photobase generator refers to an energy sensitive material which forms a basic moiety upon exposure to radiation. The polyaniline salt solution is applied on the substrate and the solvent evaporated as previously discussed forming a polyaniline salt containing layer which includes the PBG. Thereafter, an image of a pattern is introduced into the polyaniline salt containing layer by exposing such layer to patterned radiation. In irradiated areas, the PBG generates a base which reduces the conductivity in such areas to less than about $10^{-6}$ S/cm.

It is advantageous to attach integrated circuits on printed wiring boards using a conductive adhesive. Conductive adhesives are generally made of an adhesive matrix that is filled with conductive particles such as silver flakes or carbon particles. The conductive particles individually or in aggregate typically have dimensions of about 5 micrometers ($\mu$m). The conductive adhesives provide an electrical and a mechanical interconnection between contact pads of the integrated circuit and the printed wiring boards. Many electronic and/or electroptic circuits typically have gaps between adjacent contact pads with dimensions on the order of tens of microns. Conductive adhesives that include particles or agglomerates having a size distribution centered around 5 $\mu$m, which also contain some agglomerates that are substantially larger than 5 $\mu$m, can be unsuitable for use on electronic and/or electroptic circuitry with gaps between adjacent contact pads having dimensions that are several tens of microns. More specifically, conductive adhesives that include particles or agglomerates with dimensions of about the same order of magnitude as the dimensions of the gaps, potentially bridge the gaps between adjacent contact pads, thereby shorting portions of the electronic circuits.

In an alternate embodiment of the present process, the polyaniline salt solution is combined with an adhesive polymer, forming a polyaniline salt/adhesive polymer mixture. A polyaniline salt containing layer which includes the adhesive polymer is formed therefrom and patterned as discussed above. Patterning the polyaniline salt containing layer which includes the adhesive polymer delineates conductive pathways which provide electrical interconnects that can be submicron in size. Examples of adhesive polymers that are compatible with polyaniline salts include thermoplastic adhesives, hot-melt adhesives and ultra-violet radiation curable adhesives.

Other objects and features of the present invention will become apparent from the following detailed description considered in conjunction with the accompanying drawings. It is to be understood, however, that the drawings are designed solely for purposes of illustration and do not serve to limit the invention, for which reference should be made to the appended claims.

DETAILED DESCRIPTION

The present invention is directed to a process for fabricating devices, e. g. integrated circuit devices (ICs). In the present process, a conductive polyaniline layer is formed on a substrate. The layer is then patterned to form a conductive polyaniline layer with the desired configuration. For example, the conductive polyaniline layer is applied onto a substrate and patterned to form one or more device features such as a gate electrode.

The conductive polyaniline layer is a polyaniline salt containing layer which has a conductivity of at least about $10^{-2}$ S/cm. The polyaniline salt containing layer is formed on the substrate by applying a polyaniline salt solution which is a mixture of polyaniline and an additive, dissolved in a solvent.

Polyaniline is a polymer which is formed by polymerizing aniline monomers. Several forms of polyaniline are listed in Table I. Polyaniline is prepared with oxidation states ranging from the fully reduced leucoemeraldine base form where all the repeat units are phenylenediamine units, to the fully oxidized perinigraniline base form where all the repeat units are quinoidal-diimine units. The particular form of polyaniline depends upon the relative amount of these two repeat units in the polymer. From the value of x in Table I, the relative number of phenylenediamine units (x) and quinoidal-diimine units (1-x) in the different forms of polyaniline is determined.

TABLE I

| x | 1.0 | 0.75 | 0.50 | 0.25 | 0 |
|---|---|---|---|---|---|
| Form of Polyaniline | leuco-emeraldine | proto-emeraldine | emeraldine | nigra-niline | per-nigraniline |
| 1 − x | 0 | 0.25 | 0.50 | 0.75 | 1.0 |

Figure 1:
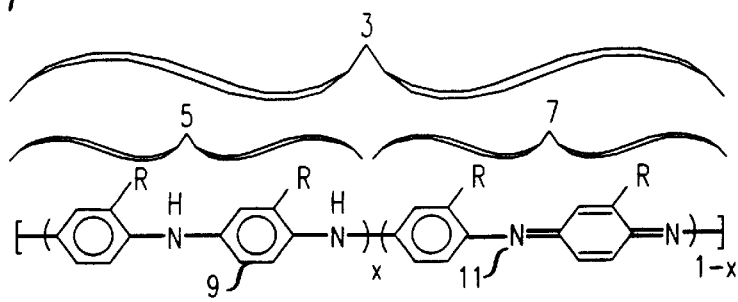
FIG. 1 depicts the structure of emeraldine polyaniline.

One form of polyaniline is emeraldine polyaniline, which is illustrated in FIG. 1. For emeraldine polyaniline, the value of x is 0.5, which provides repeat units 3 with roughly equal numbers of phenylenediamine units 5 and quinoidal-diimine units 7. The phenylenediamine units 5 and the quinoidal-diimine units 7 are either substituted or unsubstituted. Examples of suitable substituents include ortho methyl ($CH_3$) substituents on the phenylenediamine moieties 9, meta methyl substituents on the phenylenediamine moieties 9, and ortho ethyl ($C_2H_5$) substituents on the phenylenediamine moieties 9. These forms of substituted polyaniline are poly(o-toluidine), poly(m-toluidine) and poly(o-ethylaniline), respectively. Other substituents include n-butyl, n-benzyl, n-naphthyl and alkylsulfonate substituents.

Figure 2:
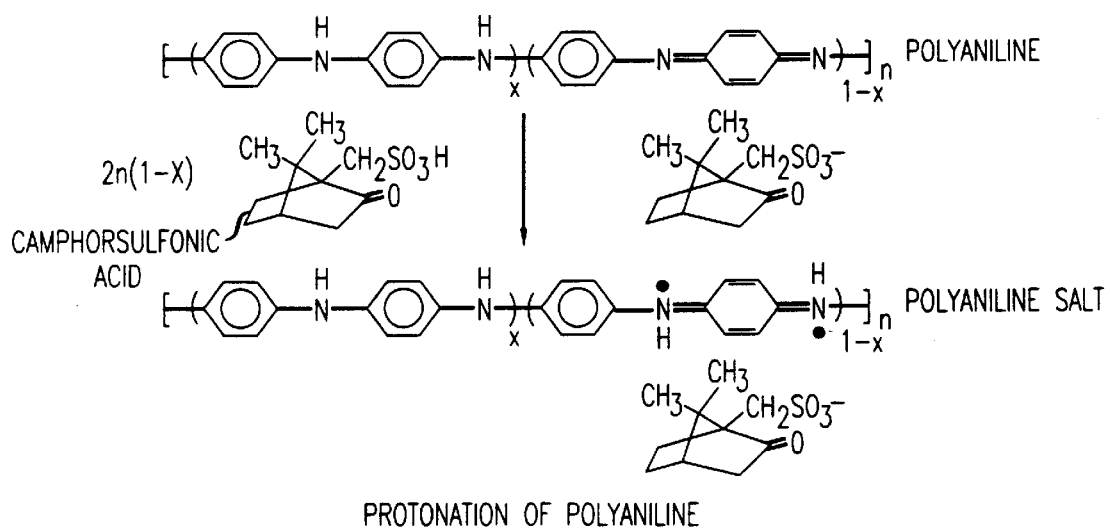
FIG. 2 illustrates a mechanism by which the polyaniline is protonated by the additive.

The additive, when dissolved in the solvent, donates protons to (protonate) the polyaniline forming a polyaniline salt, as shown in FIG. 2. Although applicants do not wish to be held to a particular theory, in one theory protonation of the polyaniline occurs on the nitrogen atoms.

cipitates with diameters less than about 0.5 µm. Many polyaniline/additive mixtures are insoluble in common organic solvents (See Table II). In Table II, an "x" indicates the polyaniline/additive mixture is insoluble in the solvent and an "S" indicates the polyaniline/additive mixture is soluble. Mixing the polyaniline with additives that contain a large anion such as CSA (shown in FIG. 3), improves the solubility of the polyaniline salt, if the mixture is dissolved in a solvent such as 2,2,2- trifluoroethanol. Additives having large anions improve the solubility of the polyaniline salt because they disrupt the crystal structure and also make the salts more lipophilic. Also, when the additive alkylbenzenesulfonic acid (ABSA) is mixed with emeraldine polyaniline, the emeraldine polyaniline salt is soluble in a solvent such as cyclohexanone.

TABLE II

| Solvents | Emeraldine Polyaniline/ Camphorsufonic Acid | Emeraldine Polyaniline/ Trifluoroacetic acid | Emeraldine Polyaniline/ 4-hydroxybenzene sulfonic acid | Emeraldine Polyaniline/ Alkylbenzene sulfonic acid |
|---|---|---|---|---|
| 2,2,2-trifluoroethanol | S | x | x | S |
| Toluene | x | x | x | S |
| Cyclohexanone | x | x | x | S |
| Ethyl 3-ethoxy-propionate | x | x | x | S |
| Propylene glycol methyl ether acetate | x | x | x | S |
| ethylene glycol dimethyl ether | x | x | x | S |
| 2-methoxyethyl ether | x | x | x | S |

Conditions required to dissociate the additive in the solution and generate charged species depend on the composition of the additive as well as the composition of the solvent in which it is dissolved (discussed below). Examples of additives suitable for generating the charged species useful for protonating polyaniline, are Bronsted acids such as camphorsulfonic acid (CSA) and alkylbenzenesulfonic acid.

Figure 3:
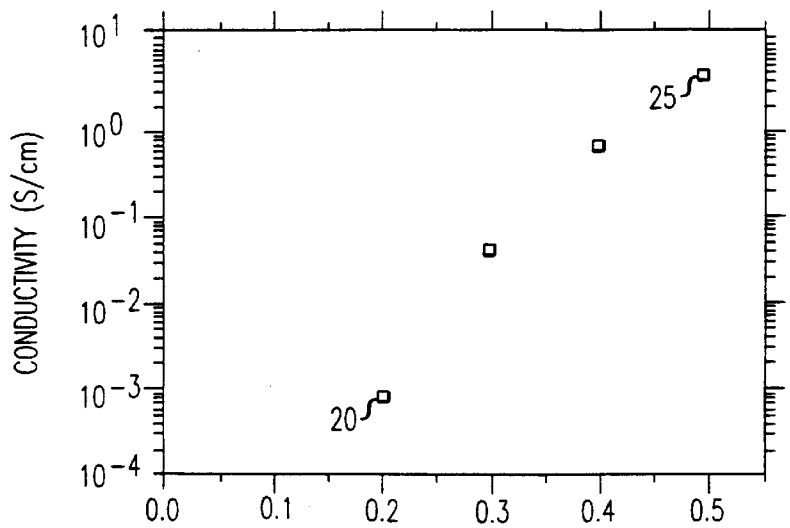
FIG. 3 is a graph showing the conductivity of emeraldine polyaniline salt as a function of the mole ratio of additive (camphorsulfonic acid (CSA)) to emeraldine aniline monomers.

The conductivity of the polyaniline salt depends on the fraction of charged species relative to the amount of polyaniline. FIG. 3 is a graph showing the conductivity of emeraldine polyaniline salt plotted as a function of the mole ratio of additive (camphorsulfonic acid (CSA)) to emeraldine aniline monomers. The graph of FIG. 3 illustrates the effect of additive concentration on the conductivity of the emeraldine polyaniline salt, indicating that an increase in the amount of additive that is mixed with the emeraldine aniline monomers increases the conductivity. For example, when the mole ratio of CSA:emeraldine aniline monomers is 0.2 the emeraldine polyaniline salt that is formed has a conductivity of about $10^{-3}$ S/cm, denoted as 20 in FIG. 3. When the mole ratio of CSA:emeraldine aniline monomers is 0.5 the emeraldine polyaniline salt that is formed has a conductivity of about $10^1$ S/cm, denoted as 25 in FIG. 3, which is an increase of about four orders of magnitude.

Figure 4:
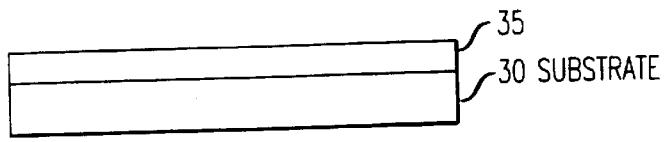
FIG. 4 is illustrative of the process of the present invention wherein a polyaniline salt containing layer is formed on a substrate.

In order to facilitate the generation of the charged species and the protonation of the aniline monomers on the polymer chain, it is desirable that the mixture of the polyaniline and the additive be substantially soluble in the solvent, which means the resulting polyaniline salt solution contains pre- In the process of the present invention, a polyaniline salt containing layer 35 is formed by applying the polyaniline salt solution combining the mixture of polyaniline and the additive, dissolved in the solvent on the surface of a substrate 30, as illustrated in FIG. 4. The polyaniline salt solution is applied to the substrate using a variety of techniques well known to those skilled in the art, such as spin-coating and casting. After the polyaniline salt solution is applied on the substrate, the solvent is removed thus forming the polyaniline salt containing layer. The solvent is typically removed through evaporation. Thicknesses for the polyaniline salt containing layer range from hundreds of angstroms to a few tens of microns.

Figure 5:
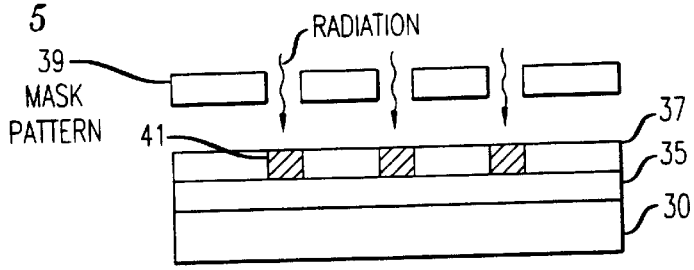
FIGS. 5 and 6 are illustrative of the process of the present invention where the polyaniline salt containing layer is patterned using conventional lithography techniques.
Figure 6:
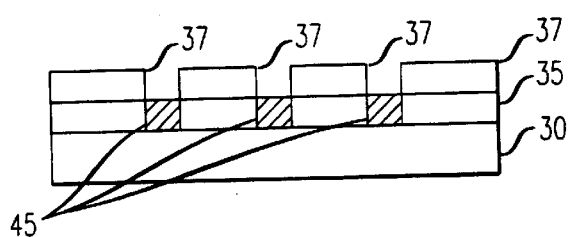

Thereafter, the polyaniline salt containing layer is patterned into a desired configuration by forming at least one region therein with a conductivity less than about $10^{-6}$ S/cm. In one embodiment conventional lithography techniques well known to one skilled in the art are used to delineate the desired configuration. For example, as shown in FIG. 5, a layer of energy sensitive resist material 37 (hereinafter referred to as resist material) is formed on the polyaniline salt containing layer. An image of a pattern 41 is introduced into the resist material 37 by exposing such material to patterned radiation through a mask, such as mask 39. Thereafter, the pattern is developed by immersing the substrate with the layer of resist material formed thereon in an aqueous basic solution. The aqueous basic solution removes the irradiated areas of resist material 41. Once the irradiated areas of resist material are removed the aqueous basic solution contacts the underlying polyaniline salt containing layer. In regions where the aqueous basic solution contacts the polyaniline salt containing layer 45 (see FIG. 6), the conductivity is reduced to less than about $10^{-6}$ S/cm.

Aqueous basic solutions suitable for removing irradiated regions of the resist layer and for reducing the conductivity of the polyaniline salt to less than about $10^{-6}$ S/cm include sodium hydroxide and tetramethylammonium hydroxide. Conditions for removing the irradiated regions of the resist layer depend on the thickness of the resist layer, the wavelength of the ultraviolet radiation, and the intensity of the radiation introduced into the resist layer. Additionally, reducing the conductivity of the polyaniline salt containing layer to less than about $10^{-6}$ S/cm using the aqueous basic solution depends on the thickness of the polyaniline salt containing layer, the composition of the polyaniline salt, as well as the concentration and composition of the aqueous basic solution.

After the polyaniline salt containing layer is patterned into the desired configuration, fabrication of the feature of the device is completed by removing the unexposed resist material 37 from the substrate 30. The resist material is removed using conventional techniques such as rinsing the substrate with a solvent that dissolves the resist material. Many resist materials are dissolved in acetone.

Some substrates have metal thereon which is etched by aqueous basic solutions such as sodium hydroxide. For example, aluminum is typically used as the interconnect metallization on integrated circuits. Sodium hydroxide solutions etch aluminum. Thus, for substrates that are metallized with aluminum, it is undesirable to reduce the conductivity of the polyaniline salt containing layer by immersing such substrates in sodium hydroxide solutions, since the aluminum is potentially etched by this solution.

In an alternate embodiment, the polyaniline salt containing layer is formed from a polyaniline salt solution which combines a mixture of polyaniline, an additive, and a photobase generator (PBG), dissolved in a solvent. The term photobase generator refers to an energy sensitive compound which forms a basic moiety upon exposure to radiation.

Figure 7:
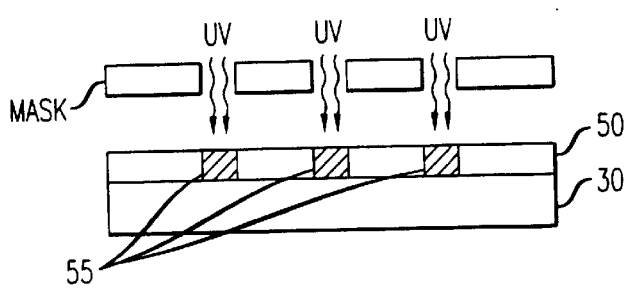
FIG. 7 is illustrative of the process of the present invention where a polyaniline salt containing layer that includes a photobase generator (PBG) is formed on a substrate and patterned.

The polyaniline salt solution containing the PBG is applied on the substrate using the techniques previously mentioned. After the solvent is removed, a polyaniline salt containing layer 50 which includes the PBG is formed on the substrate 30, as shown in FIG. 7. The polyaniline salt containing layer which includes the PBG has a conductivity of at least about $10^{-2}$ S/cm. The thicknesses of the polyaniline salt containing layer which includes the PBG is preferably less than about 5 $\mu$m.

An image of a pattern is introduced into the polyaniline salt containing layer 50 using conventional lithography techniques, as previously discussed. Conditions required to introduce the image of the pattern into the polyaniline salt containing layer 50 depend on the concentration of the PBG therein.

When the image of the pattern is introduced into the polyaniline salt containing layer, the PBG is exposed to patterned radiation. In these irradiated areas, the PBG generates a base which reduces the conductivity to less than about $10^{-6}$ S/cm.

Figure 8:
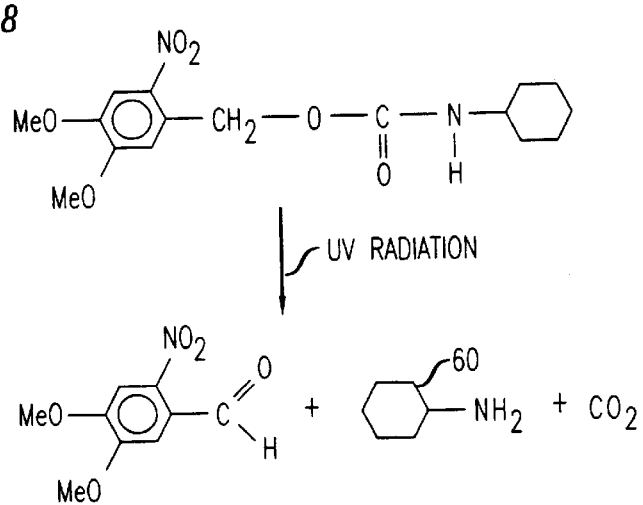
FIG. 8 illustrates the mechanism by which the PBG forms a basic moiety upon exposure to radiation.

An example of a PBG suitable for reducing the conductivity of emeraldine polyaniline salt to less than about $10^{-6}$ S/cm is N-2-nitro-4,5-dimethoxybenzyloxycarbonylcyclohexylamine, shown in FIG. 8. Upon exposure to ultraviolet radiation having a wavelength of about 365 nm, N-2-nitro-4,5-dimethoxybenzyloxycarbonylcyclohexylamine produces cyclohexylamine, denoted as 60, which deprotonates the emeraldine polyaniline salt.

The areas of the polyaniline salt containing layer which have conductivities less than about $10^{-6}$ S/cm are optionally removed by dissolving such areas in solvents for the base form of polyaniline, such as N-methylpyrrolidinone (NMP).

It is advantageous to attach integrated circuits on printed wiring boards using a conductive adhesive. Conductive adhesives are made of an adhesive matrix that is filled with conductive particles such as silver flakes or carbon particles. The conductive particles individually or in aggregate typically have average dimensions of about 5 micrometers ($\mu$m). Conductive adhesives provide an electrical and a mechanical interconnection between contact pads of the integrated circuit and the printed wiring boards. Conductive adhesives useful for providing electrical interconnection typically have conductivities of at least about $10^{-4}$ S/cm.

Most electronic and/or electroptic circuits typically have gaps between adjacent contact pads with dimensions on the order of tens of microns. Conductive adhesives that include particles or agglomerates with a size distribution centered around 5 $\mu$m, which also contain some agglomerates that are substantially larger than 5 $\mu$m, can be potentially unsuitable for use on electronic and/or electroptic circuitry having gaps between adjacent contact pads with dimensions on the order of several tens of microns. More specifically, conductive adhesives that have particles or agglomerates with dimensions that are about the same order of magnitude as the dimensions of the gaps, potentially bridge the gaps between adjacent contact pads, thereby shorting portions of the integrated circuits.

In an alternate embodiment of the present invention, the polyaniline salt solution is combined with an adhesive polymer to form a polyaniline salt/adhesive polymer mixture. The polyaniline salt/adhesive polymer mixture is formed by dissolving the polyaniline salt solution in the adhesive matrix of an adhesive polymer.

A number of commercially available adhesive polymers are capable of being blended with polyaniline to form the polyaniline salt/adhesive polymer mixture. These adhesive polymers include thermoplastics such as polyether aliphatic polyurethane (e.g., P-3429 and PN03 obtainable from K. J. Quinn & Co., Malden, Mass.) and poly(vinyl acetate) (obtainable from Aldrich Chemical Co.), commercial hot-melt adhesives such as polyethylene phthalate (e.g., Crystal Bond 509 obtainable from Aremco Products, Inc., Ossining, N.Y.), and ultraviolet radiation curable acrylate adhesives (e.g., NOA65 obtainable from Norland Products, Inc., New Brunswick, N.J.).

The polyaniline salt/adhesive polymer mixture is applied on a substrate and a polyaniline salt containing layer which includes the adhesive polymer is formed on a substrate and patterned as previously discussed. Thicknesses for the polyaniline salt containing layer which includes the adhesive polymer range from thousands of angstroms to a few tens of microns. The thickness depends on the surface topography of the substrate and is easily determined by a person skilled in the art with a test sample. Patterning the polyaniline salt containing layer which includes the adhesive polymer delineates conductive pathways, which provide electrical interconnects that can be submicron in size.

Additionally, metal contacts such as aluminum discs can be attached to patterned and/or unpatterned areas of the polyaniline salt/adhesive polymer layer. The metal contacts are optionally attached by heating the polyaniline salt/adhesive polymer layer or by applying a small amount (less than one drop) of a solvent such as trifluoroethanol (TFE) on the surface of such layer to form a mechanical contact.

The following examples are exemplary of suitable conditions employed in the inventive procedure.

EXAMPLE 1

Emeraldine polyaniline was synthesized from the oxidation of o-toluidine by ammonium persulfate in an acid medium. About 10.7 g of o-toluidine was dissolved in 300 ml of 1M HCl. The o-toluidine solution was placed in an ice/water bath and cooled. A few grains of ferrous sulfate were added to the o-toluidine solution as a catalyst. A solution of ammonium persulfate (4.6 g in 100 ml of 1M HCl) was cooled in an ice/water bath and added dropwise to the o-toluidine solution over a period of about 10 minutes with vigorous stirring. After all of the ammonium persulfate was added, the mixture was cooled in a refrigerator for 2 hours. It was then filtered using a Buchner funnel, washed with about 300 ml of 1M HCl and dried in a vacuum oven at room temperature for about 48 hours. The emeraldine polyaniline was stirred for 48 hours in an aqueous solution of 0.1 M ammonium hydroxide ($NH_4OH$, 100 ml for every gram of solid). $NH_4OH$ (1M) was added to the suspension to maintain a pH of around 10. The emeraldine polyaniline was filtered using a Buchner funnel, washed with a 1:1 mixture of methanol and 0.2 M $NH_4OH$ and allowed to dry in a vacuum oven for 48 hours.

Emeraldine polyaniline (0.2 g) and camphorsulfonic acid (0.25 g) were ground together in a mortar. The mixture was added to 20 ml of 2,2,2-trifluoroethanol (TFE) and agitated in an ultrasonicator for at least 48 hours. The camphorsulfonic acid and the TFE were obtained from Aldrich Chemical Company. During agitation, an emeraldine polyaniline salt was formed and dissolved in the solvent. After agitation, the polyaniline salt solution was filtered through a filter having 0.5µm openings.

The filtered polyaniline salt solution was spin-coated on a silicon substrate by pouring the solution over the center of the silicon substrate and then spinning the silicon substrate at a speed of about 250 RPM to about 350 RPM for approximately 20 seconds, to spread the solution over the surface of the silicon substrate. TFE has a boiling point in the range 77–80° C. The excess solvent was removed from the surface of the silicon substrate by heating the coated substrate to a temperature of about 80° C., thus forming an emeraldine polyaniline salt containing layer having a thickness of about 0.1 µm to about 0.5 µm.

The emeraldine polyaniline salt containing layer, formed on the silicon substrate, had a conductivity of about 3 S/cm. The conductivity was measured using a 1865 Megohm Meter commercially available from Quad Tech Company.

A layer of Microposit SC1827 resist material was formed over the emeraldine polyaniline salt containing layer. The Microposit SC1827 is a novolac-quinone diazide resist material available from the Shipley Company. The resist layer was formed by pouring the Microposit SC1827 over the center of the silicon substrate and then spinning the substrate at a speed of about 3500 RPM for approximately 20 seconds to spread the resist material over the surface of the emeraldine polyaniline salt containing layer. The silicon substrate including the polyaniline salt containing layer as well as the resist material was baked at a temperature of about 110° C. to about 120° C. for less than about 90 seconds.

The layer of Microposit SC1827 was patterned by exposing areas to 365 nm ultraviolet radiation for about 10 seconds to about 60 seconds through a mask using a Model NT19 metal halide exposure system available from NuArc Company Inc. Niles, Ill. The irradiated areas of the layer of Microposit SC1827 resist were removed by immersing the substrate in a 0.26 N solution of tetramethylammonium hydroxide for approximately 20 seconds. While the irradiated areas of the resist material were being removed the tetramethylammonium hydroxide solution contacted the underlying emeraldine polyaniline salt containing layer, reducing its conductivity. Thereafter, the unexposed Microposit SC1827 was removed from the substrate by rinsing with acetone.

The regions of the emeraldine polyaniline layer which were in contact with the sodium hydroxide solution had a conductivity of about $10^{-10}$ S/cm. The conductivity was measured using the Quad Tech 1865 Megohm Meter.

EXAMPLE 2

An emeraldine polyaniline salt solution was prepared as described in Example 1. A PBG, N-2-nitro-4,5-dimethoxybenzyloxycarbonylcyclohexylamine (0.027g) was dissolved in the emeraldine polyaniline salt solution (0.376g). The solution containing the emeraldine polyaniline salt with the PBG was applied on a silicon substrate and an emeraldine polyaniline salt containing layer including the PBG was formed according to the conditions detailed in Example 1. The emeraldine polyaniline salt containing layer including the PBG had a thickness of about 0.1 µm to about 0.5 µm.

The emeraldine polyaniline salt containing layer including the PBG had a green color, which is typical for the conductive emeraldine polyaniline salt having a conductivity greater than about $10^{-3}$ S/cm. The emeraldine polyaniline salt containing layer including the PBG was patterned by exposing areas to 365 nm ultraviolet radiation for up to 60 minutes at a power output of from 6.6 mW/cm$^2$ to 7.1 mW/cm$^2$, through a mask. In irradiated areas, the emeraldine polyaniline layer turned a blue color, which is typical for polyaniline that is nonconductive (conductivity less than about $10^{-6}$ S/cm).

EXAMPLE 3

An emeraldine polyaniline salt solution was prepared as described in Example 1. The polyaniline salt solution (0.3 ml) was mixed with an adhesive polymer solution (0.2 ml). The adhesive polymer solution was prepared by mixing 0.04–0.4g of polyether polyurethane in 1–10 ml of 2,2,2-trifluoroethanol. The polyether polyurethane was P3429, obtained from K. J. Quinn & Co. The solution containing the emeraldine polyaniline salt/adhesive polymer mixture was filtered through a filter having 0.1–0.5 µm openings and then applied onto an ITO coated glass substrate. An emeraldine polyaniline salt containing layer which includes the adhesive polymer was formed and patterned according to the conditions described in Example 1. The emeraldine polyaniline salt containing layer which includes the adhesive polymer had a thickness of about 0.1 µm to about 0.5 µm.

Aluminum discs (5 mm diameter) were placed on both exposed areas and unexposed areas of the emeraldine polyaniline salt containing layer which includes the adhesive polymer. The aluminum discs were heated to a temperature above the glass transition temperature of the adhesive polymer, to adhere them thereto.

The conductivity of patterned areas of the emeraldine polyaniline salt containing layer which includes the adhesive polymer was measured between the ITO layer and the aluminum discs. The exposed areas of the emeraldine polyaniline salt containing layer which includes the adhesive polymer had a conductivity of about $10^{-6}$–$10^{-10}$ S/cm. The unexposed areas of the emeraldine polyaniline salt containing layer which includes the adhesive polymer had a conductivity greater than about $10^{-2}$ S/cm.

EXAMPLE 4

An emeraldine polyaniline salt solution was prepared as described in Example 1. The polyaniline salt solution (0.75 ml) was mixed with an adhesive polymer solution (0.25 ml). The adhesive polymer solution was prepared by mixing 0.40g of polyethylene phthalate in 1–10 ml of 2,2,2-trifluoroethanol. The polyethylene phthalate was Crystal Bond 509, obtained from Aremco Products, Inc. The solution containing the emeraldine polyaniline salt/adhesive polymer mixture was filtered through a filter having 0.1–0.5 μm openings and then applied onto an ITO coated glass substrate. An emeraldine polyaniline salt containing layer which includes the adhesive polymer was formed and patterned according to the conditions described in Example 1. The emeraldine polyaniline salt containing layer which includes the adhesive polymer had a thickness of about 0.1 μm to about 0.5 μm.

Aluminum discs (5 mm diameter) were placed on both exposed areas and unexposed areas of the emeraldine polyaniline salt containing layer which includes the adhesive polymer. The aluminum discs were attached to the emeraldine polyaniline salt containing layer which includes the adhesive polymer by applying a trace of TFE (less than 1 drop) on the polyaniline salt/adhesive polymer layer and gluing the discs thereto.

The conductivity of patterned areas of the emeraldine polyaniline salt containing layer which includes the adhesive polymer was measured between the ITO layer and the aluminum discs. The exposed areas of the emeraldine polyaniline salt containing layer which includes the adhesive polymer had a conductivity of about $10^{-6}$–$10^{-10}$ S/cm. The unexposed areas of the emeraldine polyaniline salt containing layer which includes the adhesive polymer had a conductivity greater than about $10^{-2}$ S/cm.

The invention claimed is:

1. A method for fabricating a device, comprising the steps of:

applying a solution which combines a mixture of polyaniline and an additive, dissolved in a solvent on a substrate, wherein the polyaniline has the structure

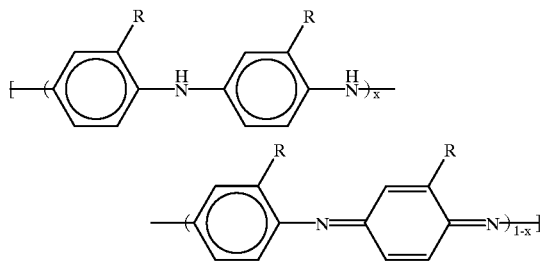

wherein $0 \leq x \leq 1$, wherein R is selected from the group consisting of an alkyl, and alkyl sulfonate, and an aryl, and wherein the additive dissociates and forms a polyaniline salt;

evaporating the solvent to form a polyaniline salt containing layer on the substrate, wherein the polyaniline salt containing layer has a conductivity greater than about $10^{-2}$ S/cm and wherein the polyaniline salt containing layer has a thickness less than about 10 microns; and delineating at least one region in the polyaniline salt containing layer wherein the at least one region has a conductivity less than about $10^{-6}$ S/cm.

2. The method of claim 1 wherein delineation of the at least one region in the polyaniline salt containing layer comprises the steps of:

forming a layer of energy sensitive resist material over the polyaniline salt containing layer;

introducing an image of a pattern into the energy sensitive resist material by exposing the energy sensitive resist material to patterned radiation;

developing the pattern with an aqueous basic solution, wherein the aqueous basic solution removes the irradiated energy sensitive resist material and wherein the aqueous basic solution that contacts uncovered areas of the underlying polyaniline salt containing layer forms the at least one region having the conductivity less than about $10^{-6}$ S/cm; and removing the unexposed energy sensitive resist material.

3. The method of claim 2 wherein the aqueous basic solution is selected from the group consisting of sodium hydroxide and tetramethylammonium hydroxide.

4. The method of claim 1 wherein the additive is selected from the group consisting of camphorsulfonic acid and alkylbenzenesulfonic acid.

5. The method of claim 1 wherein the solvent is selected from the group consisting of 2,2,2-trifluoroethanol and cyclohexanone.

6. The method of claim 1 wherein the additive is camphorsulfonic acid and the solvent is 2,2,2-trifluoroethanol.

7. The method of claim 1 wherein the mixture further comprises an energy sensitive compound that generates a basic moiety when exposed to radiation.

8. The method of claim 7 wherein delineation of the at least one region in the polyaniline salt containing layer comprises introducing an image of a pattern into the polyaniline salt containing layer by exposing the polyaniline salt containing layer to patterned radiation, wherein the basic moiety generated by the energy sensitive compound forms the at least one region in the polyaniline layer having the conductivity less than about $10^{-6}$ S/cm.

9. The method of claim 1 wherein the mixture further comprises an adhesive polymer.

10. The method of claim 9 wherein the adhesive polymer is selected from the group consisting of thermoplastic adhesives, hot-melt adhesives and ultraviolet radiation curable adhesives.

* * * * *